United States Patent
Li et al.

(10) Patent No.: US 11,526,073 B2
(45) Date of Patent: Dec. 13, 2022

(54) PELLICLE AND METHOD OF MANUFACTURING SAME

(71) Applicant: Taiwan Semiconductor Manufacturing Co., Ltd., Hsinchu (TW)

(72) Inventors: Po Hsuan Li, Tainan (TW); Yu-Ting Lin, Tainan (TW); Yun-Yue Lin, Hsinchu (TW); Huai-Tei Yang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/692,912

(22) Filed: Mar. 11, 2022

(65) Prior Publication Data

US 2022/0197132 A1    Jun. 23, 2022

Related U.S. Application Data

(63) Continuation of application No. 16/573,850, filed on Sep. 17, 2019, now Pat. No. 11,340,525.

(60) Provisional application No. 62/747,385, filed on Oct. 18, 2018.

(51) Int. Cl.
*G03F 1/62* (2012.01)
*G03F 7/20* (2006.01)

(52) U.S. Cl.
CPC ............. *G03F 1/62* (2013.01); *G03F 7/2004* (2013.01)

(58) Field of Classification Search
CPC ............. G03F 1/62; G03F 1/64; G03F 7/2004
USPC .......................................................... 430/5
See application file for complete search history.

(56) References Cited

U.S. PATENT DOCUMENTS

| | | | |
|---|---|---|---|
| 8,764,995 B2 | 7/2014 | Chang et al. |
| 8,796,666 B1 | 8/2014 | Huang et al. |
| 8,828,625 B2 | 9/2014 | Lu et al. |
| 8,841,047 B2 | 9/2014 | Yu et al. |
| 8,877,409 B2 | 11/2014 | Hsu et al. |
| 9,093,530 B2 | 7/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |
| 2019/0056654 A1 | 2/2019 | Peter et al. |
| 2020/0209736 A1 | 7/2020 | Vles et al. |

OTHER PUBLICATIONS

Akiyama, Shoji et al., "Realization of EUV Pellicle with Single Crystal Silicon Membrane," Shin-Etsu Chemical Co., Ltd., Advanced Functional Materials Reasearch Center, 2009 International EUVL Symposium, Prague, Czech, 16 pages.

Park, Eun-Sang et al., "Thermal analysis of extreme ultraviolet pellicle with metallic coatings," Microelectronic Engineering, vol. 177, Jun. 5, 2017, Elsvier, Gyeonggi-do, Republic of Korea, pp. 74-77.

Shroff, Yashesh A. et al., "EUV pellicle development for mask defect control," Proceedings of SPIE, vol. 6151, SPIE 31st International Symposium on Advanced Lithography, Mar. 22, 2006, San Jose, California, 11 pages.

*Primary Examiner* — Christopher G Young
(74) *Attorney, Agent, or Firm* — Slater Matsil, LLP

(57) ABSTRACT

A pellicle comprises a stress-controlled metal layer. The stress in said metal layer may be between about 500-50 MPa. A method of manufacturing a pellicle comprising a metal layer includes depositing said metal layer by plasma physical vapor deposition. Process parameters are selected so as to produce a desired stress value in said metal layer, such as between about 500-50 MPa.

20 Claims, 14 Drawing Sheets

PELLICLE AND METHOD OF MANUFACTURING SAME

PRIORITY

This application is a continuation of U.S. patent application Ser. No. 16/573,850, filed on Sep. 17, 2019, and entitled "Pellicle and Method of Manufacturing Same" which claims priority to U.S. Provisional Patent Application No. 62/747,385, filed on Oct. 18, 2018, and entitled "Pellicle and Method of Manufacturing Same," which applications are incorporated herein by reference.

TECHNICAL FIELD

This invention relates generally to lithography, and more particularly to an improved pellicle and a method of manufacturing the same.

BACKGROUND

For decades now, the semiconductor industry has steadily reduced the minimum size of circuit features from one generation of integrated circuits to the next. Reduced features sizes allow the integration of greater levels of functionality on one integrated circuit and reduce the cost for the same functionality. Circuit features are defined by lithography. In lithography, light is patterned according to patterns embedded in reticles, and projected onto layers of a photosensitive material disposed on the integrated circuit at various steps during its manufacture. In some applications, it is beneficial to keep reticles clear of particles or contaminants, as their presence can cause distortions in intended patterns. To this end, a pellicle is often installed in close proximity to the reticle and acts as a shield against particles and contaminants. It is widely expected that Extreme Ultraviolet (EUV) lithography, operating at a wavelength of 13.5 nm, will be employed for manufacturing integrated circuits in the near future.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in different figures generally refer to corresponding parts unless otherwise indicated. The figures are drawn to illustrate clearly the relevant aspects of embodiments of the present disclosure and are not necessarily drawn to scale. To more clearly illustrate certain embodiments, a letter indicating variations of the same structure, material, or process step may follow a figure number.

DETAILED DESCRIPTION

The making and using of embodiments are discussed in detail below. It should be appreciated, however, that the present disclosure provides many applicable inventive concepts that may be embodied in a wide variety of specific contexts. The specific embodiments discussed are merely illustrative of specific ways to make and use the invention, and do not limit the scope of the invention. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, spatially relative terms, such as "below", "above", "lower", "upper", "beneath", and the like, may be used herein for ease of description to describe one element or feature's relationship to another element(s) or feature(s) as illustrated in the figures. Spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Herein, the terms "light" and "radiation" are used interchangeably, as are the terms "reticle" and "mask".

Figure 1:
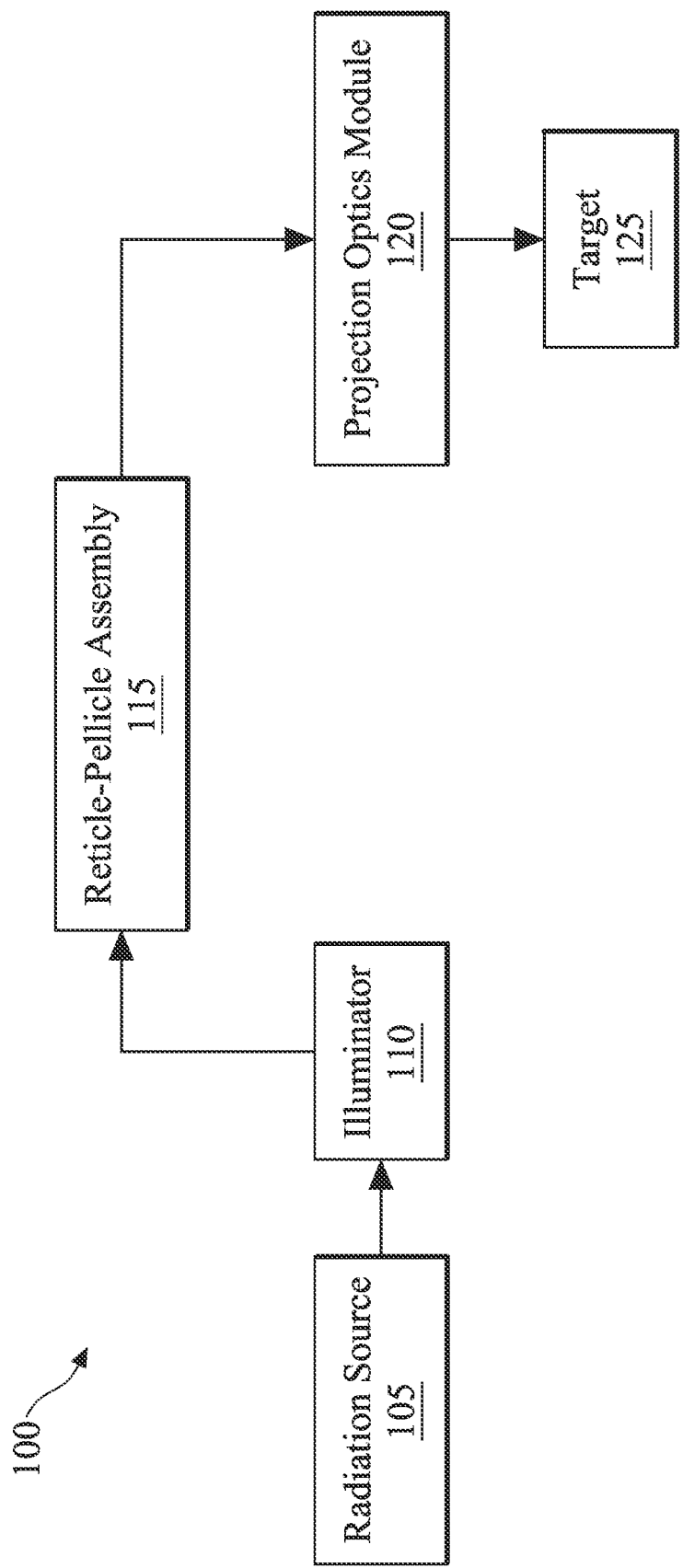
FIG. 1 is a block diagram of elements of an Extreme Ultra Violet (EUV) lithography system.

FIG. 1 is a block diagram of elements of an Extreme Ultra Violet (EUV) lithography system. An EUV lithography system 100 comprises a radiation source 105, an illuminator 110, a reticle-pellicle assembly 115, a projection optics module 120, and a target 125. EUV radiation is generated in the radiation source 105. Radiation in a range of wavelengths extending approximately from 10 to 125 nm may be considered extreme ultraviolet. Plasmas are known to radiate EUV light, and may be produced in a several ways. A Laser-Produced Plasma (LPP) may be generated when a laser beam imparts enough energy to a piece of matter to turn it into a plasma. A Discharge-Produced Plasma (DPP) is usually produced when an electric discharge is formed through a gas. EUV lithography systems typically operate at a wavelength of 13.5 nm. Tin (Sn) plasmas are known to radiate light at this wavelength, and they may be laser-produced. The radiation source 105 may comprise apparatus for generating a plasma.

Extreme ultraviolet light generated in the radiation source 105 is directed to the illuminator 110, which in turn directs the light to the reticle-pellicle assembly 115. The illuminator 110 may comprise a number of EUV mirrors. All matter absorbs radiation at 13.5 nm. Therefore, EUV lithography systems typically employ reflective optics, rather than lenses. However, reflection from a single interface between two materials is usually too weak to be of use in practical EUV lithography. It is possible to achieve higher reflectively by constructing a multi-layer reflector comprising tens of alternating layers of two materials with differing indices of refraction. Multi-layer reflectors constructed from layers of molybdenum (Mo) and silicon (Si) commonly achieve reflectivity values well in excess of 50% at the operating wavelength of 13.5 nm.

Figure 2:
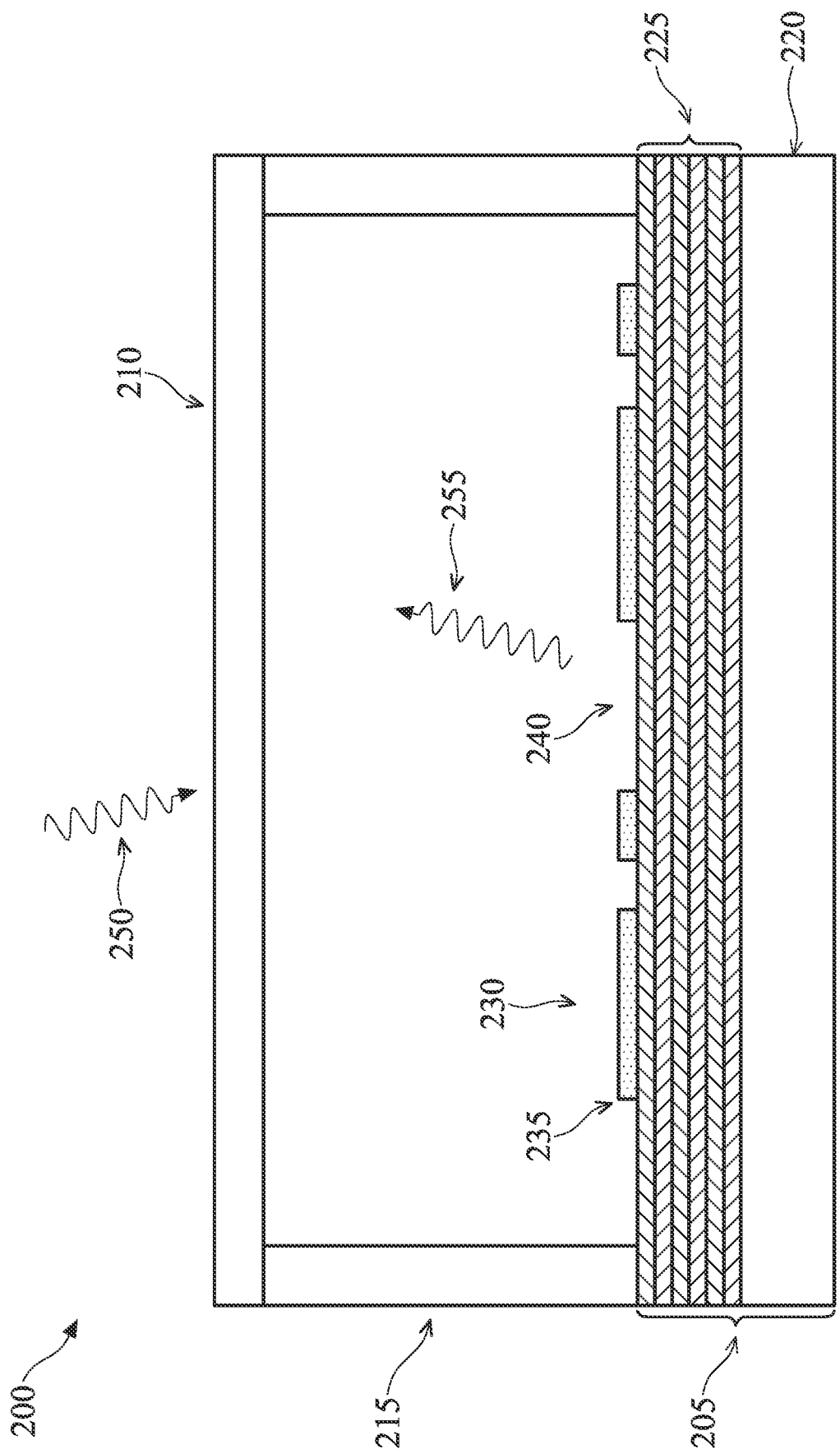
FIG. 2 is an illustration of selected components of an EUV reticle-pellicle assembly.

FIG. 2 is an illustration of selected components of an EUV reticle-pellicle assembly. An EUV reticle-pellicle assembly 200 comprises a reticle 205 and a pellicle 210. The pellicle 210 may be mounted on the reticle 205 using a mounting frame 215. The reticle 205 comprises a substrate 220 and a multi-layer reflector 225. In addition, the reticle 205 comprises one or more regions 230, wherein an EUV absorber material 235 is disposed on the multi-layer reflector 225, and one or more regions 240, where the absorber material 235 is absent. The regions 230 and 240 are formed in accordance with a desired pattern of circuit features. In the lithography operation, incident EUV light 250 arrives at the pellicle 210. A portion of incident EUV light is absorbed in the pellicle 210. The remaining portion passes through the pellicle 210 and arrives at the reticle 205. In regions 240, EUV light is reflected from the multi-layer reflector 225. In contrast, in regions 230, EUV light is absorbed and not reflected. Light 255 reflected from the reticle 205, thus patterned, arrives at the pellicle 210 and substantially passes through it.

The reticle 205 depicted in FIG. 2 is commonly referred to as a reflective mask. It is realized herein, however, that other types of reticles may be used in a reticle-pellicle assembly, such as a reflective attenuated Phase-Shift Mask (AttPSM) or a reflective alternating Phase-Shift Mask (AltPSM). In Deep Ultra Violet (DUV) lithography systems, the reticle may be a transmission or phase-shift reticle on material substantially transparent to the wavelength used therein.

Referring to FIG. 1, patterned light reflected from the reticle-pellicle assembly 115 is projected onto the target 125 by the projection optics module 120. The projection optics module 120 commonly comprises EUV mirrors and typically produces an optical magnification less than one, projecting a smaller version of the pattern of the reticle onto the target 125. The target 125 may be a substrate having a photosensitive layer disposed thereon. EUV light thus projected onto the target layer imparts the pattern into the photosensitive layer, and developing the photosensitive layer realizes the desired pattern over the underlying target. The target substrate may be a semiconductor wafer formed from semiconductors such as silicon, germanium, compound semiconductors, and the like, or a combination thereof. Furthermore, the target substrate may be silicon-on-insulator (SOI), include an epitaxial layers, or comprise strained areas for performance enhancement. The target substrate may include a plurality of dies formed or partially formed thereon. Each die may include any number of semiconductor devices, such as field effect transistors (FETs), capacitors, resistors, conductive interconnects, or other suitable devices, in various stages of fabrication. The target substrate may include various semiconductor regions doped with suitable dopants. Exemplary regions include active regions on which MOS devices can be formed. The doped regions, including but not limited to active regions, may vary in dimension, dopant level, configuration, or other properties. The boundaries of the active regions may be defined by isolation structures such as shallow trench isolation (STI) features. Furthermore, one or more layers to be patterned, e.g., insulative, conductive, and/or semiconductive material, may be formed on the substrate as well. The photosensitive layer is a material sensitive to the radiation employed in the lithography system, and may be positive tone or negative tone photoresist. The photosensitive layer may be formed on the target substrate by spin-on coating, soft baking, or other methods, or combinations thereof. Since EUV light of wavelength 13.5 nm is absorbed in all matter, and in particular in all un-ionized inert gases, the path of EUV light from the radiation source 105 to the target 125 is commonly enclosed in vacuum.

Figure 3A:
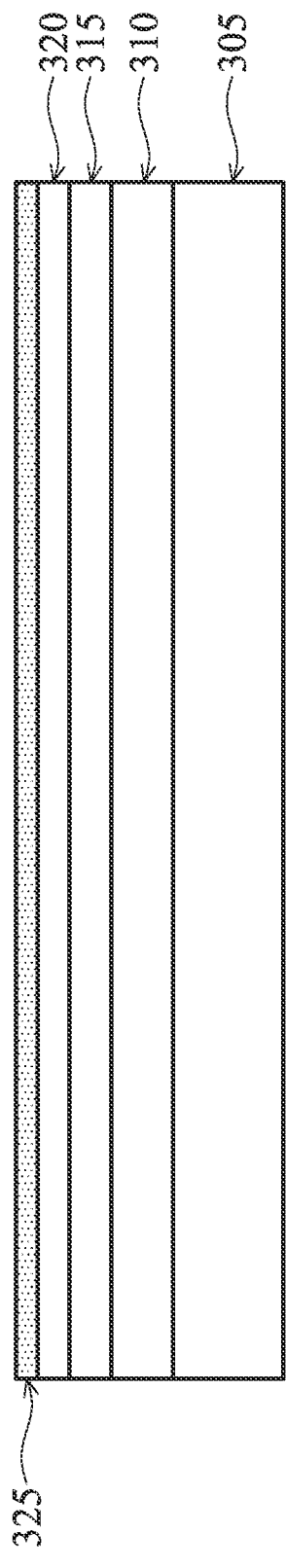
FIG. 3A is an illustration of additive steps in an embodiment of a method for manufacturing a pellicle comprising a stress-controlled emissivity layer.

FIG. 3A is an illustration of additive steps in an embodiment of a method for manufacturing a pellicle comprising a stress-controlled metal layer. The method begins with the formation of a first etch-stop layer 310 on a silicon wafer 305. In some embodiments, the first etch-stop layer 310, e.g., AlN, AlO, BN, BO, SiC, SIN, $SiO_2$, and their related compound, ranges in thickness from about 1000 to about 10000 Å. The material can be stoichiometric, for example, $SiO_2$ or $Al_2O_3$, or in other embodiments non-stoichiometric. In various embodiments, the first etch-stop layer 310 is deposited, for example by a plasma physical vapor deposition (PVD) and CVD process, or grown thermally. Next, a second etch stop layer 315 is formed on the first etch-stop layer 310. In some embodiments, the second etch-stop layer 315 can be metal or dielectric materials such as nickel (Ni), copper (Cu), Molybdenum (Mo), Tungsten (W) or AlN, AlO, BN, BO, SiC, SIN, and SiO. The ranges in thickness from about 200 to about 1000 Å, and is deposited by a PVD and CVD process. Next, a non-metal layer 320 is formed on the second etch-stop layer 315. In various embodiments, the non-metal is Si, SiN, SiC, $SiO_2$, or the like, and ranges in thickness from about 50 to about 1000 Å. This layer can be single layer or multi-layer for optical properties requirements. Next, a stress-controlled metal layer 325 is formed on the non-metal layer 320. Herein, the term "metal" may include metalloids as well as metals. Accordingly, in various embodiments, the stress-controlled metal layer 325 is a metal such as Mo, Zr, Nb, B, Ti, Ru, RuNb, RuTi, RuZr, RuTi, MoSi, ZrSi, NbSi, or NiZrSi, Rh, Pd, and their alloy or the like, and in other embodiments, a metalloid such as Ge. In general terms, the metal is in some embodiments substantially amorphous or semi-crystalline to polycrystalline in structure. In various embodiments, the stress-controlled metal layer 325 ranges in thickness from about 10 to about 500 Å. In other embodiments, the single stress-controlled metal layer 325, two or more metal layers are used to form a stress-controlled metal stack, and each layer may be a different metal or alloy. Although light of wavelength 13.5 nm is absorbed in both the non-metal layer 320 and the stress-controlled metal layer 325, the thicknesses of these layers are chosen to be thin enough to limit absorption of the light in these layers, preferably to no more than a few percent. The stress properties of the stress-controlled metal layer 325 and process embodiments for its formation are disclosed further below.

Figure 3B:
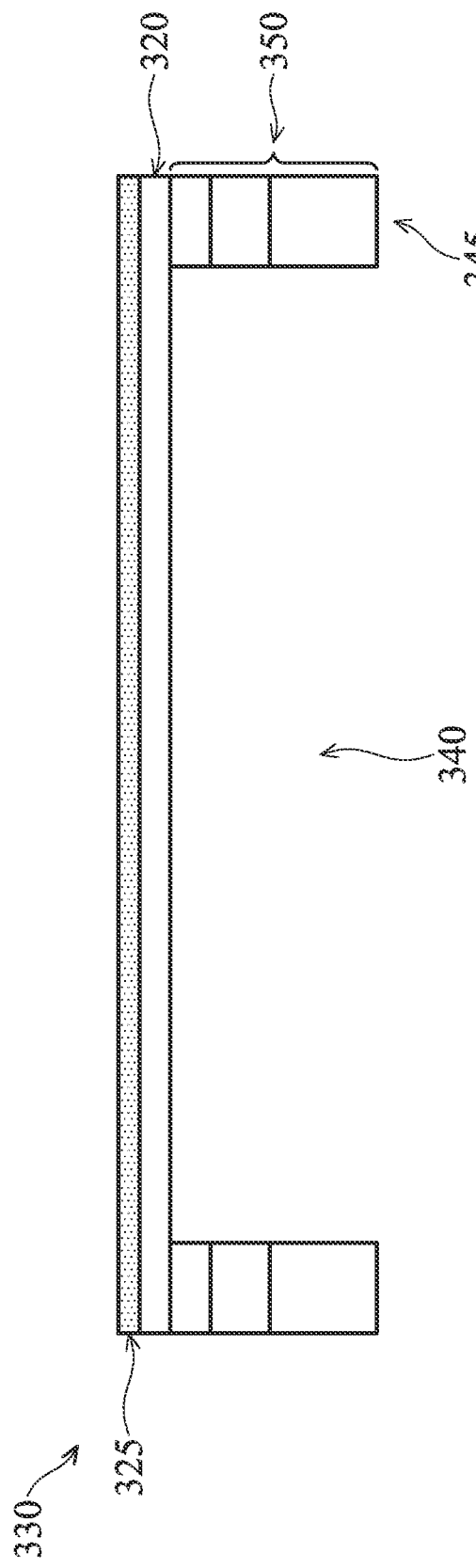
FIG. 3B is an illustration of an embodiment of a pellicle comprising a stress-controlled emissivity layer.

FIG. 3B is an illustration of an embodiment of a pellicle comprising a stress-controlled metal layer. Starting with the structure illustrated in FIG. 3A, a pellicle 330 is formed as follows. First, the silicon wafer 305 is removed in an optically active area 340, but not in a sustaining frame area 345. In various embodiments, the optically active area 340 and the sustaining frame area 345 may have a variety of shapes, including square, circular, hexagonal, or polygonal, and the shapes of the optically active area 340 and the sustaining frame area 345 may be different. In some embodiments, TMAH, EDA, and KOH and like the same solutions at concentrations ranging from 0.1 to 5M are used to remove the silicon wafer 305 in the optically active area 340. Next, the first etch-stop layer 310 is removed in an area substantially the same as in the optically active area 340. In an embodiment, the first etch-stop layer 310 is AlN, AlO, BN, BO, SiC, SiN, or $SiO_2$ and is removed. Next, the second etch-stop layer 315 is removed in an area substantially the same as in the optically active area 340. In an embodiment, the second etch-stop layer is nickel (Ni), copper (Cu), Molybdenum (Mo), Tungsten (W) and AlN, AlO, BN, BO, SiC, SiN, or $SiO_2$, and is removed using a typical metal etchant solution such as HF, $H_2SO_4$, Nitric acid and like the same being at concentrations ranging from 0.01 to 5 M. In the illustrated embodiment of FIG. 3B, the portions removed of the layers 305, 310 and 315 are all of substantially the same shape (i.e., all corresponding to the size and shape of the optically active area 340). In other embodiments, however, the respective portions removed for the layers 305, 310, and 315 need not be of the same size or shape, resulting in a different sidewall profile for the optically active area 340.

The structure resulting from the above steps is the pellicle 330 that includes layers 320 and 325 for protecting a reticle, as described above, and also remnants of the layers 305, 310, and 315, which form a sustaining frame 350, which may be used sustain the layers 320 and 325. As noted above, the thicknesses of the layers 320 and 325 are chosen to limit absorption of light therein. As a result, in the optically active area 340, the pellicle 330 is substantially transparent to EUV light. The pellicle 330 may be further mounted on an additional metallic or dielectric or ceramic, ceramic-glass mounting frame, such as the mounting frame 215 illustrated in FIG. 2, and installed on a reticle for operation in a lithography system. The pellicle 330 may also be mounted such that it is removable from the reticle, for replacement or cleaning, to allow or inspection or cleaning of the reticle, or for other purposes. It is contemplated herein that the pellicle 330 may be used advantageously in lithography systems other than EUV, such as Deep Ultra Violet (DUV), X-ray, soft X-ray (SX), or the like.

During the operation of the lithography system, a portion of EUV light is absorbed in and heats the pellicle. The stress-controlled metal layer 325 radiates a portion of the absorbed heat into the surrounding vacuum, raising the rate of heat dissipation of the pellicle, typically to 5 to 35 K/ms, and partially cooling the pellicle. In some embodiments, stress-controlled metal layers are employed on both sides of the non-metal layer 320, enhancing heat dissipation. Control of stress in the stress-controlled metal layer 325 is advantageous. In particular, low stress enhances the resilience of the metal film and therefore the pellicle against long-term use. The stress here is preferable controlled from about 1000 MPa to about 50 MPa, more preferably 500-50 MPa. A low-stress film offers another advantage as well. Without adequate resilience, the non-metal layer 320 and the stress-controlled layer 325 must be mechanically supported within the optically active area 340. Furthermore, any supporting material within the optically active area 340 must not significantly absorb or alter the EUV light passing through the pellicle. With a low-stress film, such as stress-controlled metal layer 325, such support is unnecessary, and the sustaining frame 350 is sufficient to support the reticle.

In various embodiments, the stress-controlled metal layer 325 may be formed using processes such as thermal spraying, plasma spraying, plasma chemical vapor deposition processes, or plasma physical vapor deposition (PVD) processes, including RF-only plasma PVD, DC-only plasma PVD, RF-plus-DC plasma PVD, or pulse-DC plasma PVD. Plasma physical vapor deposition is sometimes referred to as sputtering.

Figure 4:
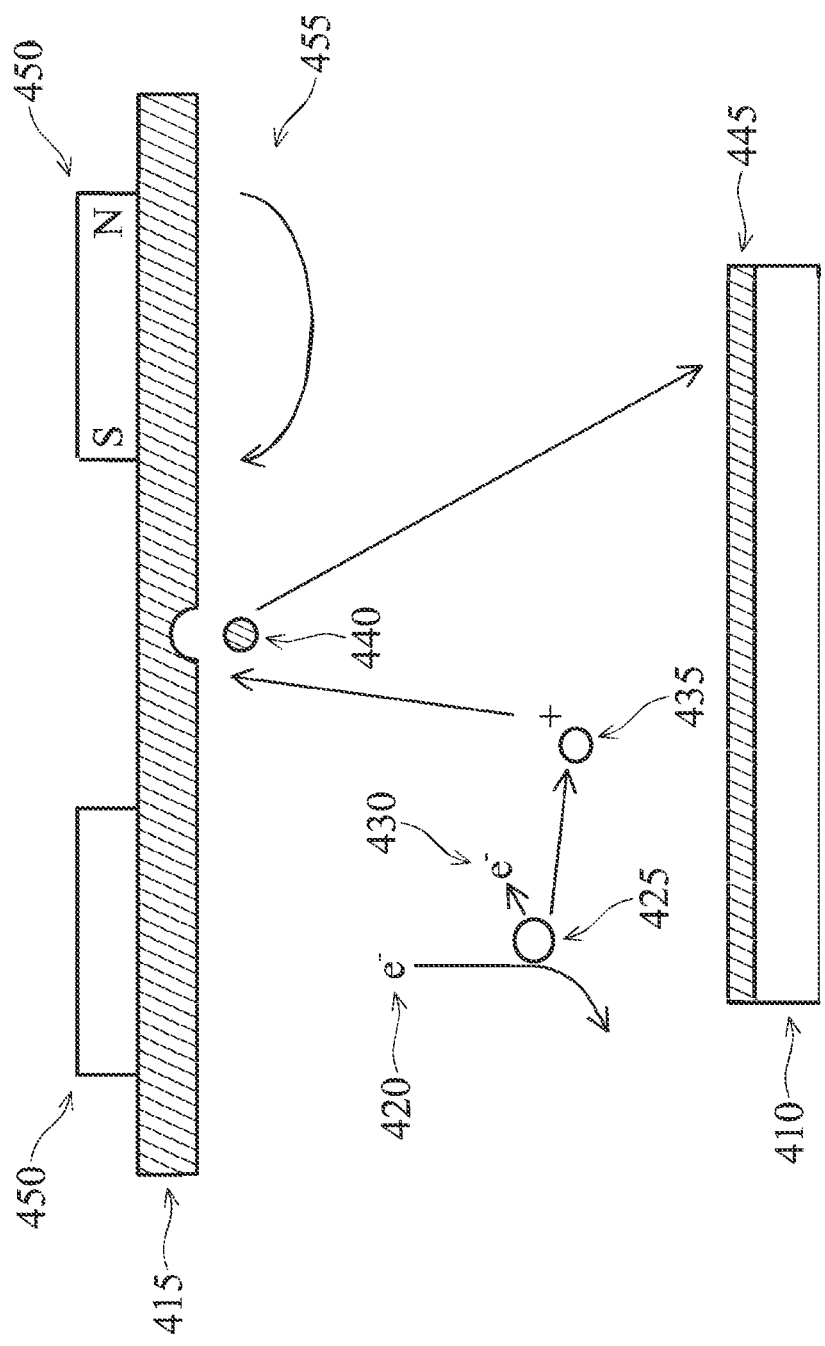
FIG. 4 is an illustration of selected elements of an exemplary deposition process.

FIG. 4 is an illustration of selected elements of an exemplary plasma physical vapor deposition process. A substrate 410 is placed in vacuum. Substrate 410 could be the same substrate 305 illustrated in FIG. 3A along with one or more of layer 310, 315 and 320, or other layers, in some embodiments. A target 415 is manufactured from the material to be deposited on the substrate 410. The material to be deposited may be a metal or a dielectric. For example, if it is desired that a material such as Mo, Zr, Nb, B, Ti, Ru, RuNb, RuTi, RuZr, RuTi, MoSi, ZrSi, NbSi or NiZrSi, Rh, Pd, C and their alloy or the like and their compound or alloy be deposited on the substrate 410, the target 415 is made of Mo, Zr, Nb, B, Ti, Ru, RuNb, RuTi, RuZr, RuTi, MoSi, ZrSi, NbSi or NiZrSi, Rh, Pd, and their alloy or the like. Conversely, if it is desired that a dielectric such as tantalum oxide be deposited on the substrate 410, the target 415 is made of tantalum oxide. The target 415 is commonly larger than the substrate 410 to improve the uniformity of the deposited film. An inert gas is commonly introduced between the substrate 410 and the target 415. Argon (Ar) or Helium (He) is an advantageous inert gas, as it is cost effective, while also resulting in efficient sputtering due to its relatively high atomic mass. However, it is realized herein that other gases, inert or not, may be employed in addition to, or in lieu of, Ar in some applications. For example, a mixture of Ar and $O_2$ may be used to deposit $SiO_2$ from a Si target, or a mixture of Ar and $N_2$ may be used to deposit silicon nitride from a Si target.

Herein, DC-only operation is described first. In DC-only operation, a DC voltage is applied between the substrate 410 and the target 415. Negative DC bias is applied to the target 415 relative to the substrate 410. Accordingly, the target 415 is the cathode and the substrate 410 is the anode. As a result of the application of the DC voltage, an electric field is established between the substrate 410 and the target 415. In practice, the substrate 410 is commonly grounded and the target 415 is at a negative bias with respect to ground. An electron 420 leaves the target 415 under the influence of the electric field and is accelerated towards the substrate 410. In a chance collision with an inert gas atom 425, the electron 420 ionizes the inert gas atom 425, creating a new free electron 430 and an inert gas ion 435. Since the insert gas ion 435 is positively charged, it is accelerated towards the target 415 under the influence of the electric field. The inert gas ion 435 collides with the target 415 and ejects a target atom 440 of the target material away from the target 415. The target atom 440, which may be ejected in a variety of directions, may land on the substrate 440, where it contributes to the formation of a deposited layer 445. It is appreciated herein that the single ionization event described above is of an exemplary nature and that in practice many ionization events involving many electrons and inert gas atoms take place. Furthermore, in addition to electrons leaving the target 415, electrons generated in ionization events, such as the electron 430, may also accelerate towards the substrate 410 and ionize additional inert gas atoms. Moreover, collision of the inert gas ion 435 with the target 415 may result in the ejection of an electron (not shown) from the target 415. Such electrons are referred to as "secondary electrons", and may themselves initiate additional ionization events. In this manner, a plasma comprising many electrons and ions is formed between the target 415 and the substrate 410, and many atoms are sputtered from the target 415 and form the deposited film 445.

The efficiency of the deposition process may be enhanced through the use of a magnetron arrangement. In a magnetron PVD deposition system, magnets 450 may be used to generate a magnetic field in the vicinity of the target. A magnetic field line 455 illustrates the direction of the resulting magnetic field, indicating that the directions of the magnetic and electric fields are approximately perpendicular to each other over much of the target. Such "crossed" magnetic and electric fields confine electrons, and therefore substantially the plasma, to the vicinity of the target 415. This confinement reduces the probability of deleterious collisions between electrons and the substrate 410, and increases the efficiency of the deposition process.

During the deposition process, each inert gas ion 435 arriving at the target 415 imparts a positive charge to the target 415. If the target 415 is conducting, as in the case of targets made of metal, this charge is drained away through the bias circuitry. If, however, the target material is a dielectric, a significant positive charge can collect at the target over time, eventually leading to the quenching of the plasma altogether. A solution to this problem is to use an RF bias instead of a DC bias. With an RF bias, the positive charge collected on the target during each half cycle is canceled during the succeeding half cycle, preventing a significant charge buildup over time. An RF voltage at a frequency of 13.56 MHz is commonly used in physical vapor deposition systems, since this frequency is reserved for industrial applications. In DC-plus-RF PVD, both DC and RF biases are available for use in combination.

In addition to DC power, RF power, and duty cycle, process temperature, process pressure, and process spacing are among the parameters affecting the deposition process. The process temperature is the temperature of the substrate during deposition. If a single gas is used, the process pressure is the pressure of said gas in the process chamber. If multiple gases are employed, the partial pressure of each gas may affect the process. The process spacing is the spacing between the target and the substrate.

Referring to FIG. 3B, in one embodiment, the stress-controlled metal layer 325 is deposited on the dielectric layer 320 using a DC-only, RF, or RF-plus-DC plasma PVD process. Process pressure, temperature, DC power, RF power, duty cycle, and spacing are chosen to control the stress embedded in the stress-controlled metal layer 325.

Figure 5:
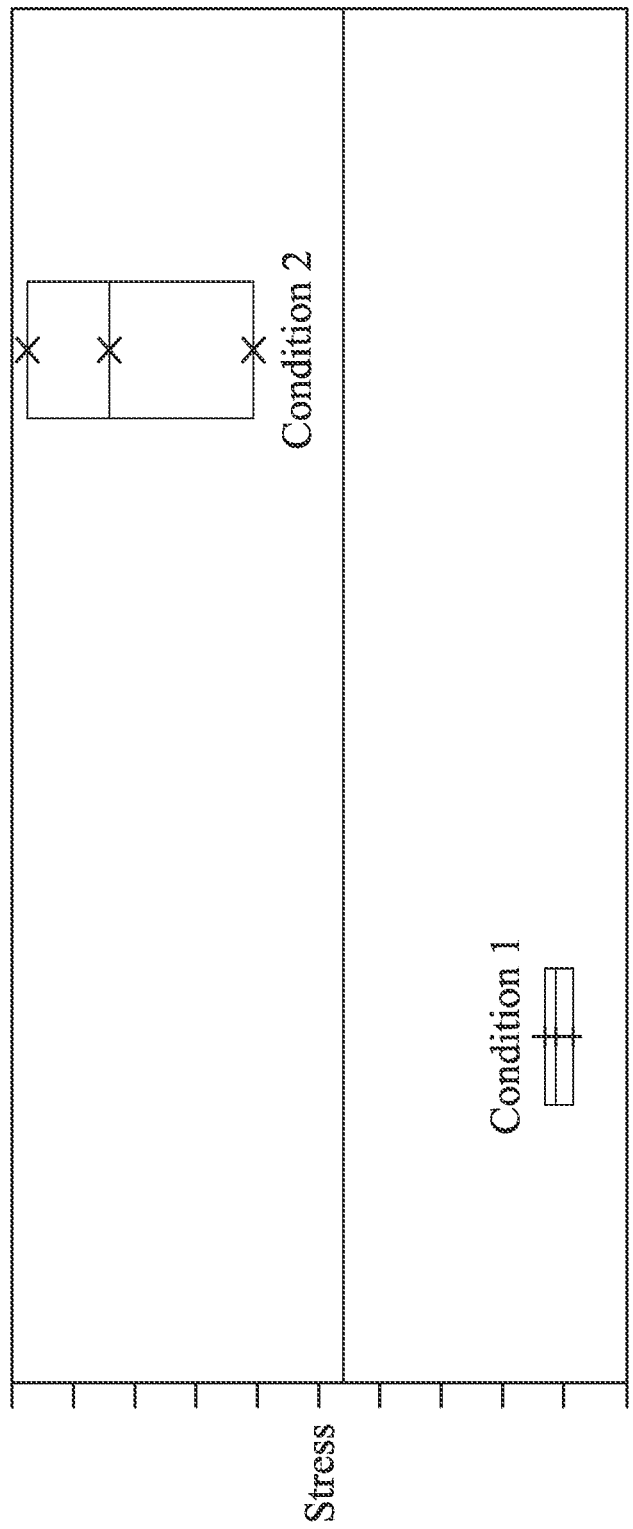
FIG. 5 is an illustration of stress values measured on first emissivity films deposited at different process conditions.

In an embodiment, process temperature and DC power are selected to from about room temperature and 150 W, respectively, to control stress in a pellicle metal film. FIG. 5 is an illustration of stress values measured on ruthenium films deposited at room temperature and a CD power of 150 W, as well as ruthenium films deposited at a temperature of 100° C. and DC power of 450 W. Positive stress values indicate tensile stress. Ru films deposited at relatively higher temperature of 100° C. and DC power of 450 W exhibit relatively high stress values in excess of 300 MPa. In contrast, Ru films deposited at room temperature and a relatively lower DC power of 150 W exhibit low stress values below 300 MPa.

In addition, stress values associated with the lower temperature and DC power settings exhibit lower variation between different films, indicating that lower stress is achieved with better control and consistency. Lower variation is advantageous because it raises the manufacturing yield of pellicles. When variation is high, even if the mean stress value itself is low, some percentage of pellicles produced exhibit high stress and must be discarded. This lowers the pellicle manufacturing yield and increases the total production cost of usable reticles.

Figure 6:
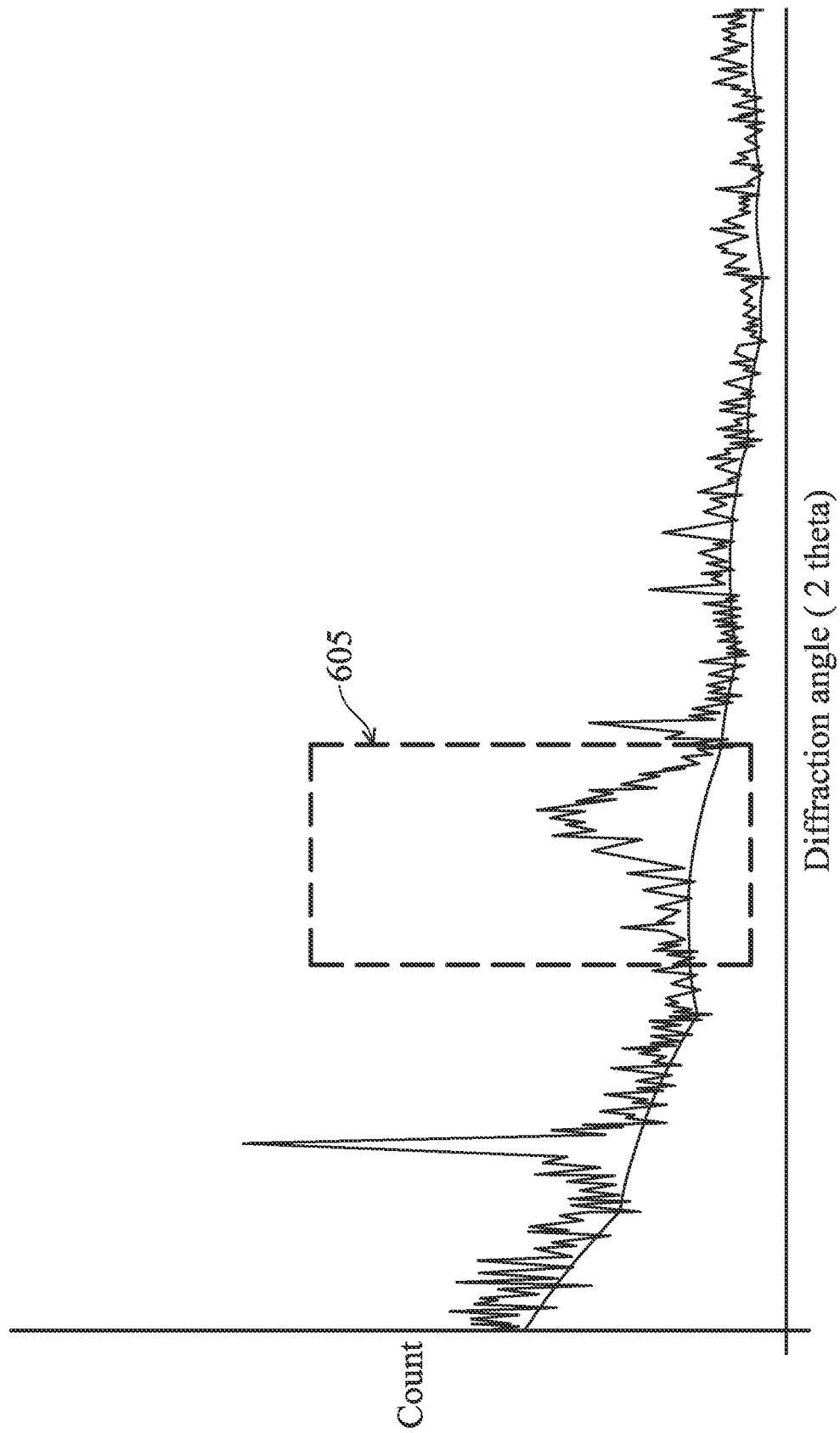
FIG. 6 is an illustration of X-ray diffraction data for first emissivity films deposited at a set of illustrative process conditions.
Figure 7:
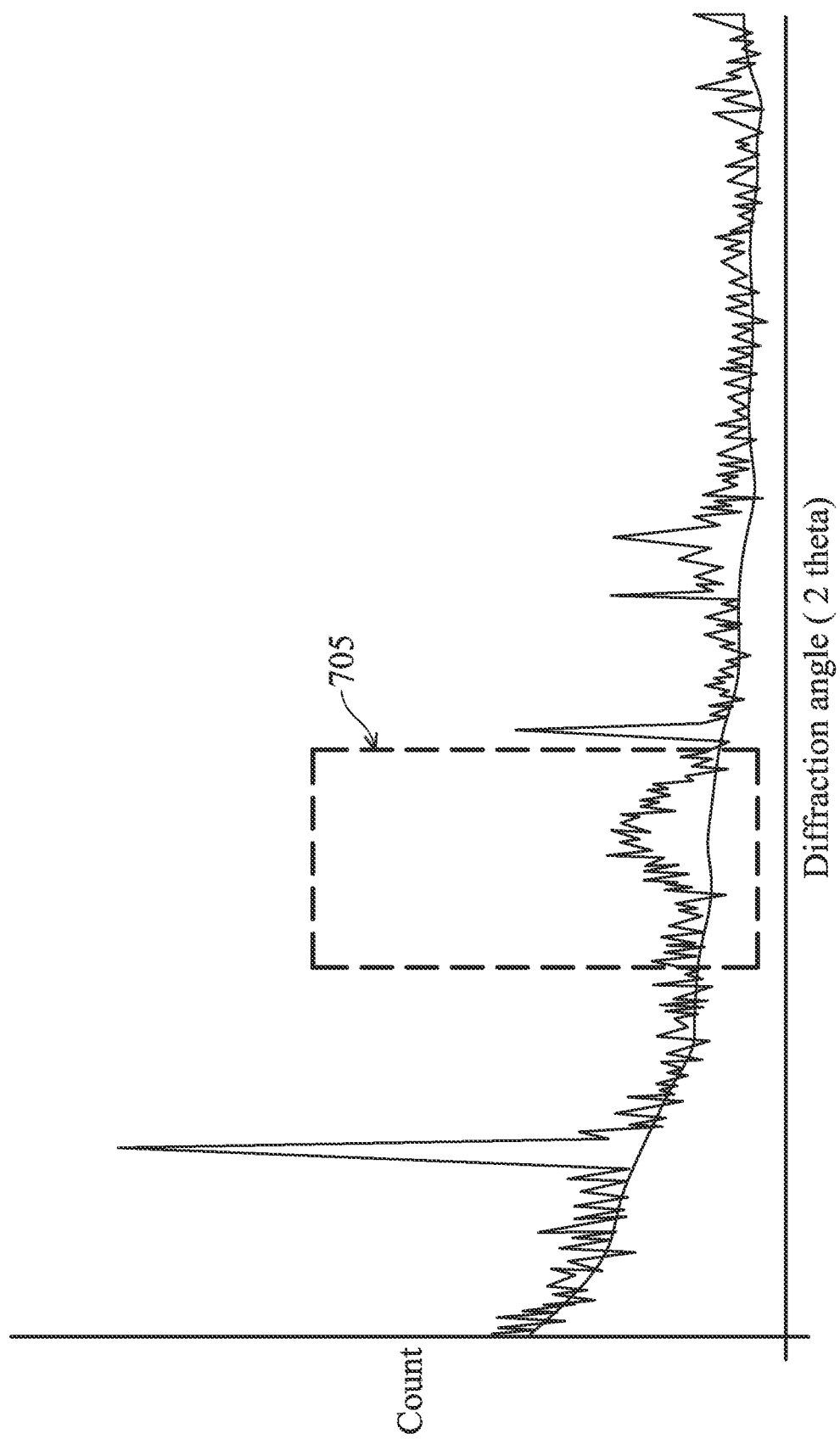
FIG. 7 is an illustration of X-ray diffraction data for first emissivity films deposited at a second set of illustrative process conditions.

FIG. 6 is an illustration of X-ray diffraction data for ruthenium films deposited at 100° C. and a DC power of 450 W. As noted above, such films generally exhibit higher stress than films deposited at room temperature and a DC power of 150 W. A region 605 of the data encompasses diffraction from (100), (002), and (101) crystalline planes. FIG. 7 is an illustration of X-ray diffraction data for ruthenium films deposited at room temperature and a DC power of 150 W. As noted above, such films generally exhibit lower stress than films deposited at a temperature of 100° C. and a DC power of 450 W. A region 705 of the data encompasses diffraction from (100), (002), and (101) crystalline planes. In the region 605 of FIG. 6 and the region 705 of FIG. 7, strong and distinct peaks in the data may be expected for highly crystalline films, and a broad and diffuse bulge may be expected for less crystalline and more amorphous films. Visual comparison of the data in the regions 605 and 705 suggests that relatively stronger peaks are present in the region 605 compared to the region 705. This indicates that relative to the higher-stress emissivity film deposited at condition 2, the lower-stress Ru film deposited at condition 1 has a more amorphous to semi-crystal texture. Quantitative analyses of the data can also be used to estimate the strengths of any peaks corresponding to diffraction from (100), (002), and (101) planes embedded in and contributing to the diffraction signal in the regions 605 and 705. Table 1 contains such estimates for the two films. Estimated peak strengths are relatively lower for the lower-stress Ru film deposited at room temperature and a DC power of 150 W, indicating that the texture of this film is relatively more amorphous. In contrast, estimated peak strengths for the Ru film deposited at 100° C. and a DC power of 450 W are relatively higher, indicating that this film has higher crystalline content. Estimated peak strengths obtained from quantitative analysis of the data thus confirm the earlier conclusion from visual inspection.

TABLE 1

| Crystalline planes | (100) | (002) | (101) |
|---|---|---|---|
| 100° C., 450 W DC | 5 | 4 | 12 |
| Room Temperature, 150 W DC | 2.8-3.2 | 1.9-2.1 | 4.5-5.5 |

Figure 8:
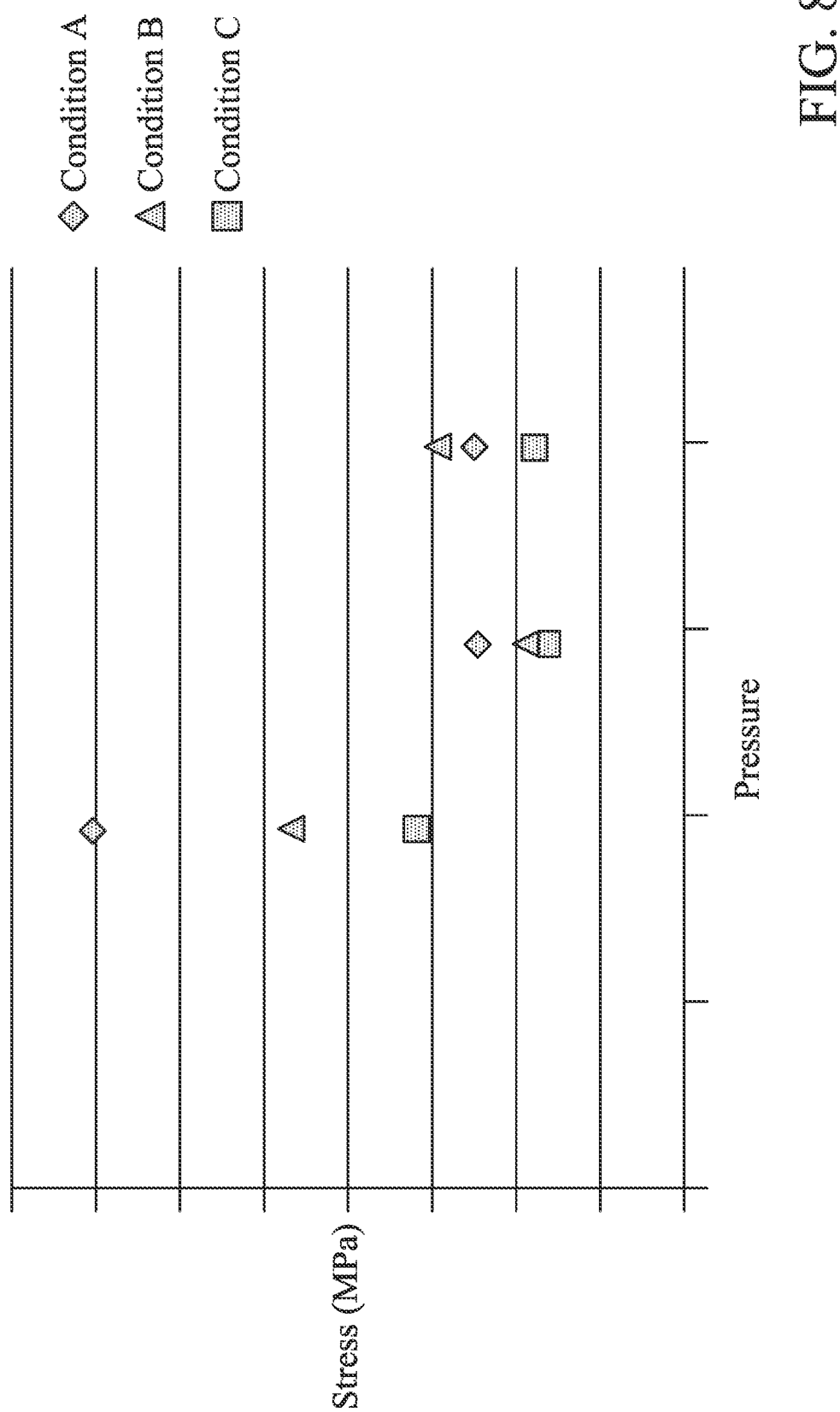
FIG. 8 is an illustration of stress values measured on first emissivity films deposited at selected values of process pressure.
Figure 9A:
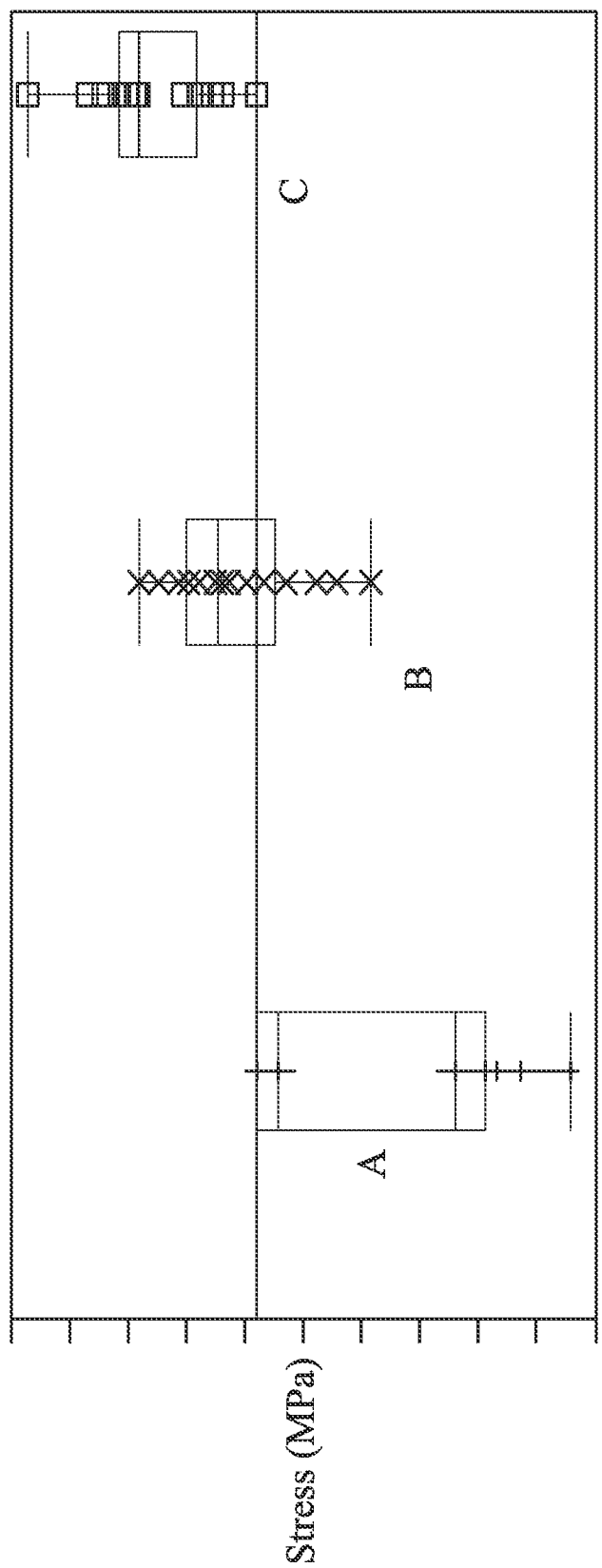
FIG. 9A is an illustration of stress values measured on second emissivity films deposited at selected values of power.
Figure 9B:
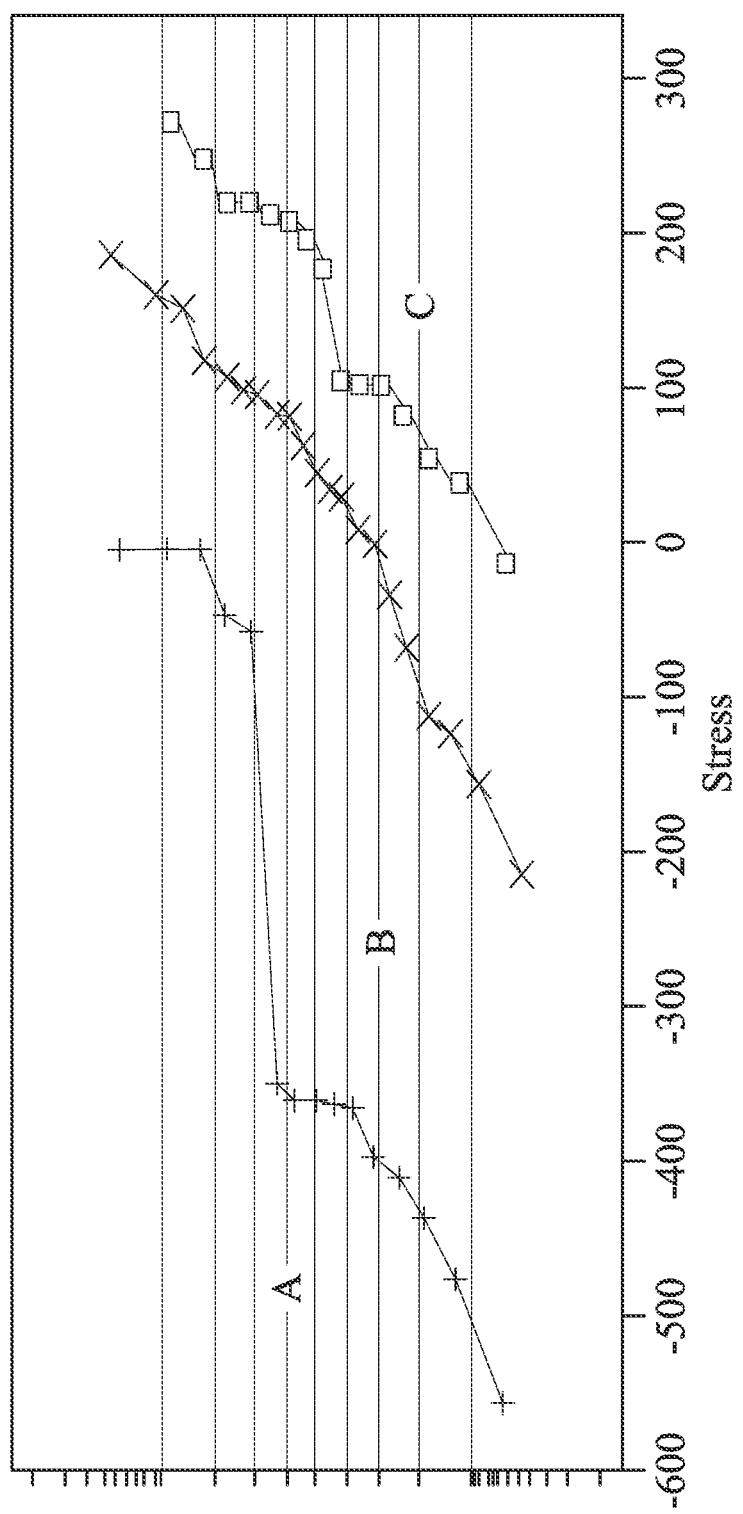
FIG. 9B is an illustration of the distribution of stress values measured on second emissivity films deposited at selected values of power.
Figure 10A:
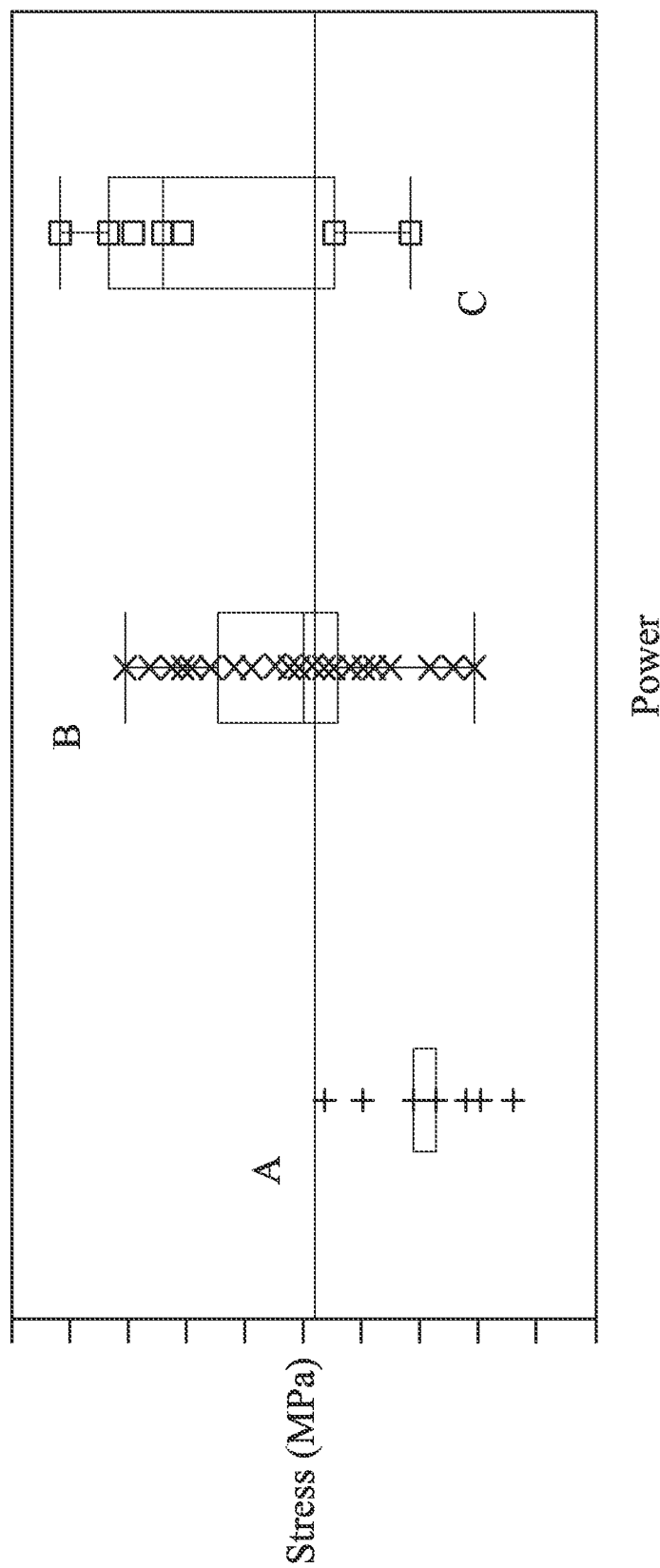
FIG. 10A is an illustration of stress values measured on first emissivity films deposited at selected values of power.
Figure 10B:
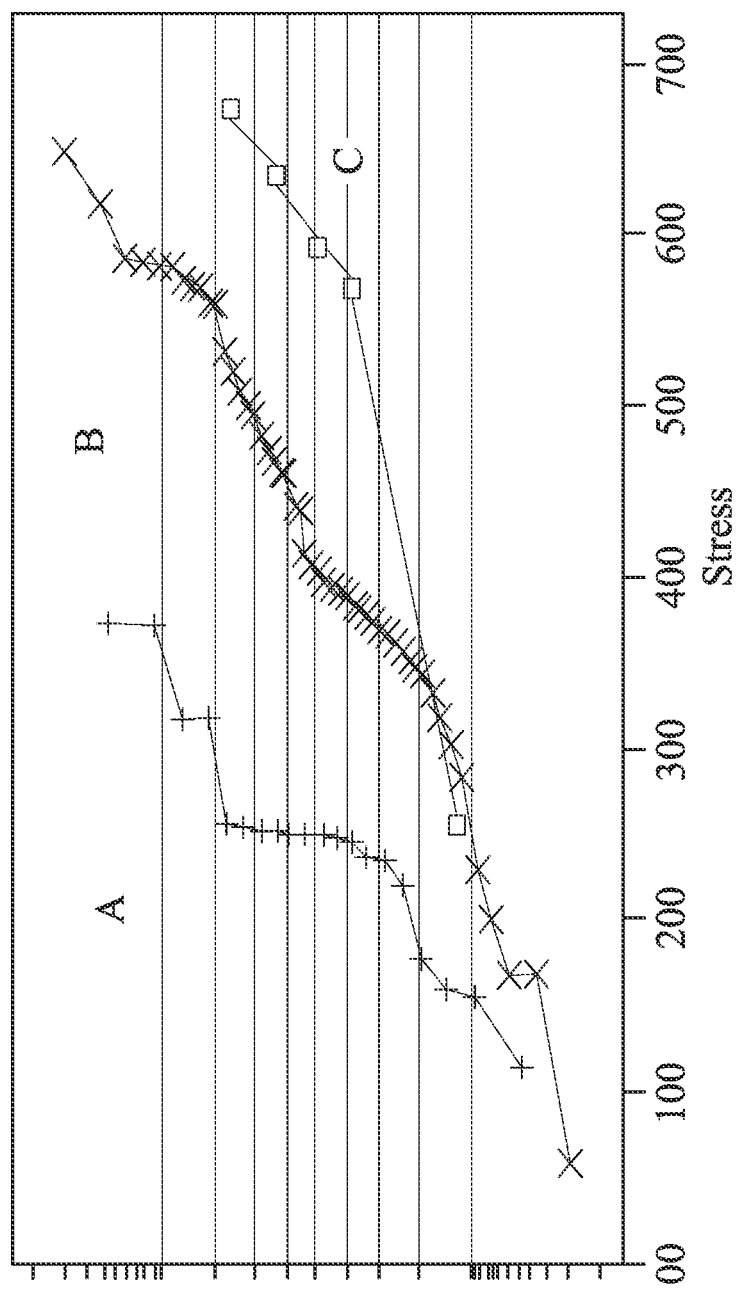
FIG. 10B is an illustration of the distribution of stress values measured on first films deposited at selected values of power.
Figure 11A:
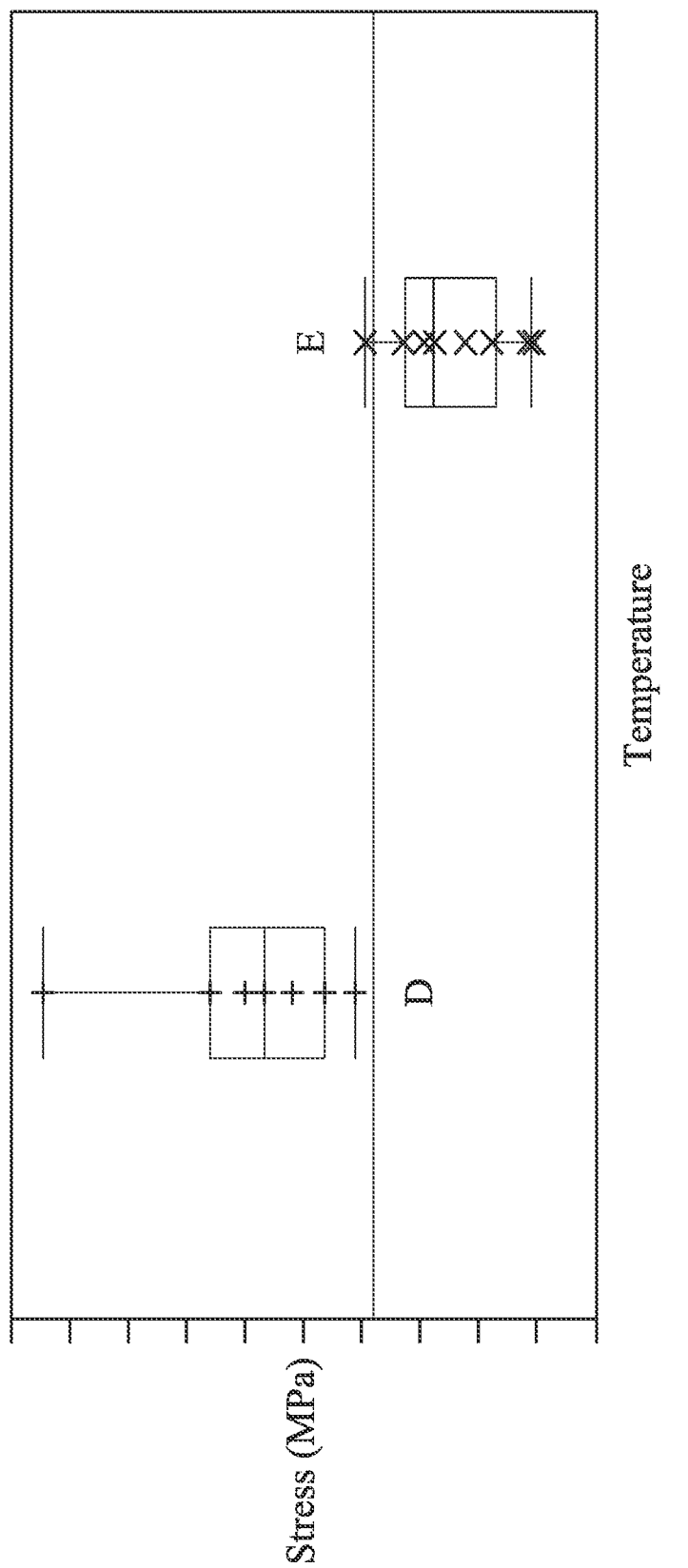
FIG. 11A is an illustration of stress values measured on two-layer stacks consisting of a second emissivity film and a first emissivity films of deposited at selected values of process temperature.
Figure 11B:
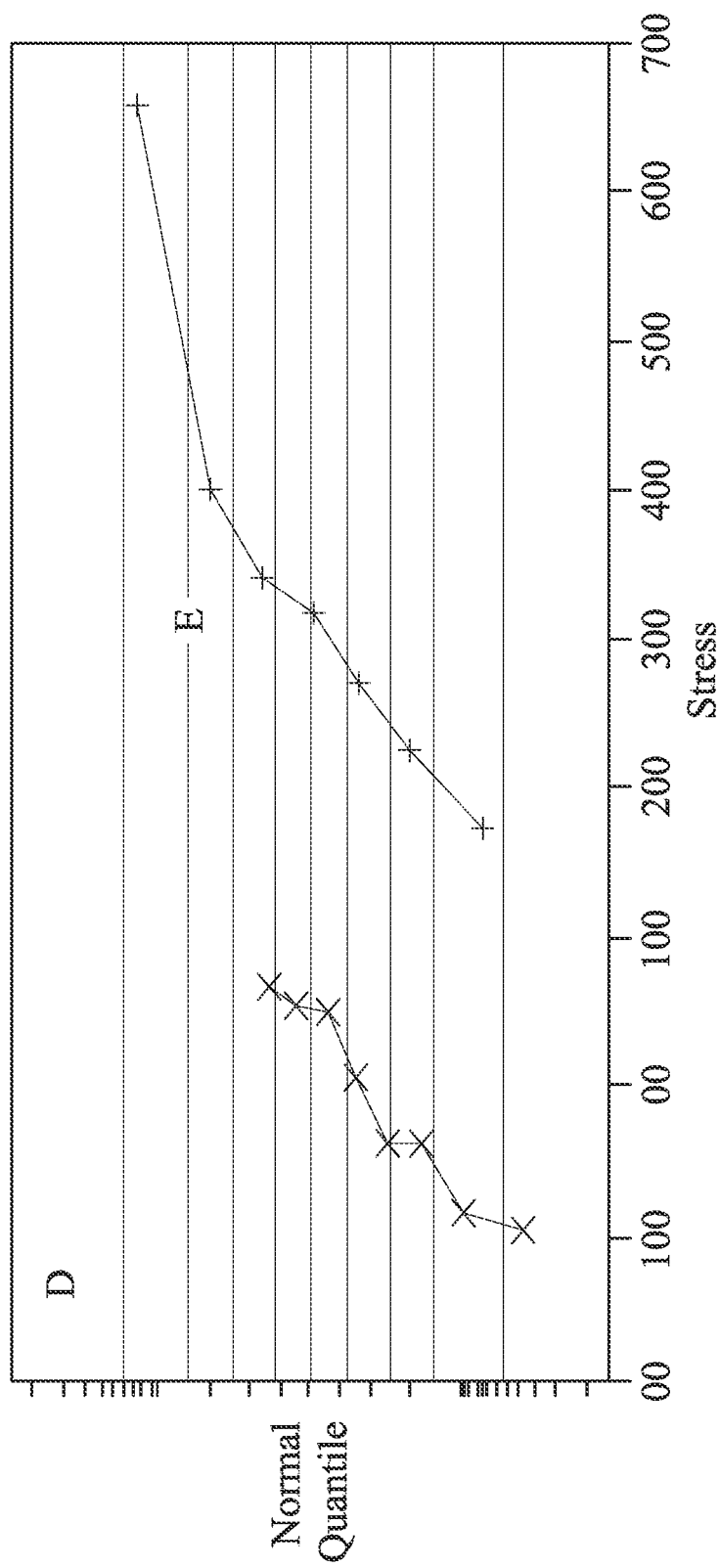
FIG. 11B is an illustration of the distribution of stress values measured on two-layer stacks consisting of a layer of first emissivity film and a second emissivity film deposited at selected values of process temperature.

In another embodiment, a process pressure of 15 mT or 20 mT is selected to control stress in a pellicle metal film. FIG. 8 is an illustration of stress values measured on emissivity films deposited at selected values of process pressure. Emissivity films deposited at a process pressure of 10 mT and three DC power settings ranging from 100 W to 450 W exhibit high tensile stress, with measured stress values over 300 MPa. By contrast, Ru films deposited at process pressures of 15 mT and 20 mT, and the same three DC power settings ranging from 100 W to 450 W, exhibit low tensile stress values below 300 MPa. As described above, the spread in measured stress values is also of interest. Wide spread lowers the pellicle manufacturing yield. The spread in measured stress values for Ru films deposited at a process pressure of 10 mT across the three DC power selections is approximately 400 MPa, with stress values as high as 700 MPa measured. For Ru films deposited at process pressures of 15 mT and 20 mT, however, the spread in measured stress values across all three DC power settings is lower than 100 MPa and just over 100 MPa, respectively, allowing all measured values to remain below 300 MPa.

It should be appreciated that multiple process parameters may be set within ranges to control the stress of a pellicle emissivity film. In an embodiment, a process pressure between 5 mT and 25 mT, a process temperature between 15° C. and 300° C., a DC power between 50 W and 400 W, and an RF power between 50 W and 1800 W, a duty cycle between 30% and 80%, and a process spacing of 50 mm and 250 mm are selected to control the stress in a pellicle metal film. These ranges are summarized in Table 2.

TABLE 2

| Parameter | Range |
| --- | --- |
| Pressure (mT) | 5-25 |
| Temperature (° C.) | 15-300 |
| DC power (W) | 50-400 |
| RF power (W) | 50-1800 |
| Duty Cycle (%) | 30-80 |
| Spacing (mm) | 50-250 |

The manner of usage of embodiments of a pellicle comprising a stress-controlled emissivity layer is similar to that of other pellicles. As shown in FIG. 2, the pellicle is installed on a reticle to protect the reticle from particles and contaminants. It may also be removable from the reticle, for replacement, to allow inspection of the reticle, or for other purposes. The manner of usage of a process to control the stress in a pellicle emissivity film is to use process settings of disclosed embodiments or similarly advantageous settings within the ranges disclosed in Table 2 in an RF-plus-DC plasma PVD or CVD system. While differences in different deposition systems may result in differences in the precise settings to achieve precisely the same process conditions, such differences are widely appreciated and are commonly taken into account without undue experimentation.

One general aspect of embodiments disclosed herein includes a pellicle including: an optically active area; a non-metal layer extending over the optically active area; and a stress-controlled metal layer on the non-metal layer and extending over the optically active area, where a stress in said metal layer is between about 5000-50 MPa.

Another general aspect of embodiments disclosed herein includes method of manufacturing a pellicle comprising depositing a non-metal layer over a substrate; and depositing a emissivity layer over the non-metal layer, wherein a stress in said emissivity layer is between about 500-50 MPa. The stress can be tensile or compressive.

Yet another general aspect of embodiments disclosed herein includes a device including: a reticle having an optically active area, the reticle configured for use in an exposure system employing radiation of a preselected wavelength; and a pellicle mounted to the reticle, the pellicle including, a second optically active area corresponding to the optically active area of the reticle, a non-metal layer extending over the second optically active area, the non-metal layer being substantially transparent to the radiation of a preselected wavelength, and a stress-controlled metal layer on the non-metal layer and extending over the optically active area, the stress-controlled emissivity layer having a stress between 500-50 MPa. The stress can be tensile or compressive.

It will also be readily understood by those skilled in the art that materials and methods may be varied while remaining within the scope of the present disclosure. It is also appreciated that the present disclosure provides many applicable inventive concepts other than the specific contexts used to illustrate embodiments. Accordingly, the appended claims are intended to include within their scope such processes, machines, manufacture, compositions of matter, means, methods, or steps.

What is claimed is:

1. A method of manufacturing a device using a lithography system, the method comprising:
   generating illumination from a light source;
   passing the illumination through a pellicle, the pellicle including:
      an optically active area,
      a non-metal layer extending over the optically active area, the non-metal layer being substantially transparent to the illumination, and
      a low-stress film on the non-metal layer and extending over the optically active area, wherein the low-stress film provides mechanical resilience sufficient to support the optically active area without the use of a separate mechanical frame;
   reflecting the illumination from a reticle;
   impinging the illumination upon a photo-sensitive material on the device to expose a pattern in the photo-sensitive material;
   patterning the photo-sensitive material; and
   patterning a layer of the device using the patterned photo-sensitive material as a mask.

2. The method of claim 1, wherein the low-stress film has a stress between 50-1000 MPa.

3. The method of claim 2, wherein the low-stress film has a stress between 50-500 MPa.

4. The method of claim 1, wherein the low-stress film is substantially transparent to the illumination.

5. The method of claim 1, wherein the step of generating illumination from a light source comprises generating illumination having a wavelength of 1.5 nm.

6. The method of claim 1, wherein the step of impinging the illumination upon a photo-sensitive material on the device includes selectively exposing portions of photo-sensitive material to form a pattern in the photo-sensitive material.

7. The method of claim 1, wherein the pellicle shields the reticle from particles and contaminants.

8. A lithography system, including:
   a radiation source configured to generate radiation of a pre-selected wavelength;
   an illuminator configured to receive radiation from the radiation source and project the illumination onto a reticle assembly;
   a pellicle interjacent the illuminator and the reticle assembly, the pellicle configured to shield the reticle assembly from particles and contamination, the pellicle including:
      a mounting frame defining an optically active area, a non-metal layer extending over the optically active area, a stress-controlled layer on the non-metal layer and extending over the optically active area, wherein the stress-controlled layer is configured to dissipate heat generated by the radiation passing through the pellicle and to provide mechanical resilience sufficient to support the non-metal layer over the optically active area without a supporting frame in the optically active area;

wherein the reticle assembly is configured to reflect the illumination in a pattern; and a projection optics module configured to receive the reflected illumination and project same onto a target.

9. The lithography system of claim 7, wherein the radiation source generates extreme ultra violet (EUV) radiation.

10. The lithography system of claim 8, wherein the stress-controlled layer has a stress in a range of from about 50 MPa to about 1000 MPa.

11. The lithography system of claim 8, wherein the mounting frame comprises a silicon base with one or more etch stop layers thereon.

12. The lithography system of claim 8, wherein the non-metal layer and the stress-controlled layer have respective thicknesses sufficient to be substantially transparent to the pre-selected wavelength.

13. The lithography system of claim 8, wherein the stress-controlled layer comprises a material selected from the group consisting of Mo, Zr, Nb, B, Ti, Ru, RuNb, RuTi, RuZr, RuTi, MoSi, ZrSi, NbSi, NiZrSi, Rh, Pd, C and alloys thereof.

14. The lithography system of claim 8, wherein the non-metal layer comprises a material selected from the group consisting of Si, SiN, SiC, and $SiO_2$.

15. The lithography system of claim 8, wherein the stress-controlled layer has a thickness from about 10 to about 500 Å.

16. The lithography system of claim 8, wherein the non-metal layer has a thickness from about 50 Å to about 1000 Å.

17. The lithography system of claim 8, wherein the stress-controlled layer comprises two or more metal layers.

18. A method comprising:

depositing one or more etch stop layers on a wafer;

depositing a non-metal layer on the one or more etch stop layers;

depositing a low-stress metal layer on the non-metal layer; and removing respective portions of the wafer and the one or more etch stop layers to form an optically active region, wherein the non-metal layer and the low-stress metal layer extend across the optically active region.

19. The method of claim 17, wherein the low-stress metal layer is deposited to have a stress of from about 50 MPa to about 100 MPa.

20. The method of claim 18, wherein the low-stress metal layer is deposited to have a thickness such that the low-stress metal layer is substantially transparent to radiation having a wavelength of 13.5 nm.

* * * * *